United States Patent [19]

Hrdlicka et al.

[11] 4,034,157
[45] July 5, 1977

[54] TEST JACK FOR MOUNTING ON PRINTED CIRCUIT BOARDS

[75] Inventors: Eugene R. Hrdlicka, Schiller Park; George J. Vincolese; John H. Szuberla, both of Elmhurst, all of Ill.

[73] Assignee: GTE Automatic Electric Laboratories Incorporated, Northlake, Ill.

[22] Filed: Sept. 2, 1975

[21] Appl. No.: 609,279

[52] U.S. Cl. .............. 179/1 PC; 179/96; 339/17 LC
[51] Int. Cl.² .......................................... H04M 3/26
[58] Field of Search ............. 179/1 PC, 29, 91 R, 179/91 A, 96, 97, 98, 175 R; 339/17 C, 17 LC, 196 R, 196 A, 206 R, 206 P, 210 R

[56] References Cited

UNITED STATES PATENTS

| 3,649,957 | 3/1972 | Baluck | 339/17 LC |
|---|---|---|---|
| 3,697,933 | 10/1972 | Black et al. | 339/17 LC |
| 3,842,212 | 10/1974 | Miller | 339/17 LC |
| 3,864,000 | 2/1975 | Coller et al. | 339/17 LC |
| 3,870,839 | 3/1975 | Almich et al. | 339/17 LC |

Primary Examiner—Kathleen H. Claffy
Assistant Examiner—Randall P. Myers
Attorney, Agent, or Firm—Robert J. Black

[57] ABSTRACT

A test jack assembly for use on printed circuit cards in which two interlocking pieces of plastic material are employed to rigidly support and insulate a number of jack springs from each other and provide contact terminals whereby the entire assembly may be easily connected to a printed circuit board.

3 Claims, 8 Drawing Figures

TEST JACK FOR MOUNTING ON PRINTED CIRCUIT BOARDS

BACKGROUND OF THE INVENTION

1. Field of the Invention

This invention relates to telephony and more particularly to a telephone test jack adapted for mounting on a printed circuit card and permitting a male type test plug to be inserted therein to permit conversation monitoring or other testing.

2. Description of the Prior Art

Existing test jacks for use with telephone circuitry are conventionally made up of a number of contact springs separated by insulators with insulated screws passed through holes in both the insulators and springs to form a rigid assembly. The entire assembly is then affixed by means of the screws using some convenient piece of hardware adjacent to the circuit to be tested and wire circuit connections are made to a terminal end of each spring.

Such arrangements do not readily adapt themselves to mounting on printed circuit boards inasmuch as they require a separate bracket or the terminal arrangement must be modified for connection to the printed circuit board. Frequently the resulting arrangement does not provide adequate rigidity and mechanical integrity with the printed circuit board. Such an arrangement when a test plug is inserted into the test jack often causes associated conductors to be broken.

In addition, the phenolic insulators used between the springs are affected by both temperature and humidity resulting in changes in the tightness or mechanical integrity of the jack assembly. The insulators also are frequently of inflammable material and thus not in accordance with current safety standards.

SUMMARY OF THE INVENTION

The present invention is a molded test jack consisting of a base portion having a number of slots therein adapted to receive the spring contacts. Each slot also is connected through an opening to the lower portion of the base. Each spring includes a terminal portion that is then extended through the hole with the portion projecting beyond the opening in the base. It is this portion of the contact that extends that can be inserted into the holes in a printed circuit card and by soldering affix thereto. A second portion of the test jack is a retaining block that fits within the confines of a shoulder portion of the base section and includes a plurality of slots that are arranged to also mate with the inserted contacts.

After the contacts have been inserted and both of the molded sections combined the entire assembly is then subjected to ultrasonic welding which permanently connects the upper and lower portions of the jack assembly together holding the springs in a rigid position, as well as providing the desired insulation between contacts.

The present arrangement by providing a more rigid assembly restricts the springs from moving after many insertions of the male jack. By designing the wired portion of the test jack with terminals to permit insertion into a printed circuit card large economic savings are made by eliminating wiring from the terminals of the existing test jack to the printed card. The present test jack is compatible with existing male type test plugs readily available in telephone exchanges. The slots included in the upper and lower portions of the molded body of the test jack are made with close tolerances to hold the spring contacts tightly. The entire assembly thus meets all current requirements for test jacks for use in combination with printed circuit equipment.

DESCRIPTION OF THE PREFERRED EMBODIMENT

Figure 1:
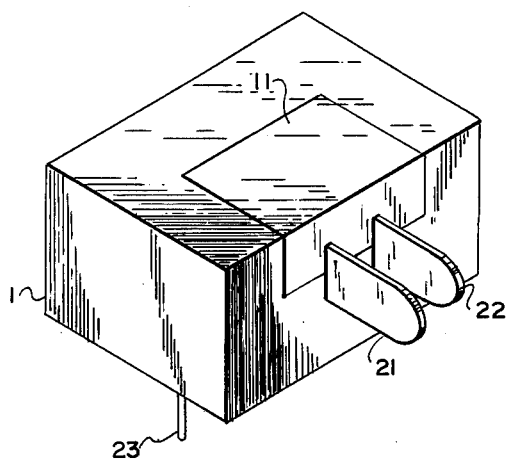
FIG. 1 is a perspective view of a test jack in accordance with the present invention.
Figure 2:
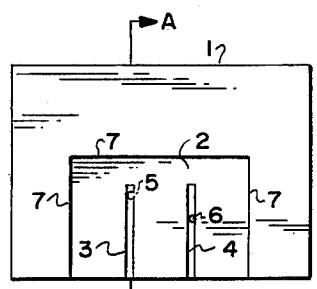
FIG. 2 is a top view of the base portion of a test jack in accordance with the present invention.
Figure 3:
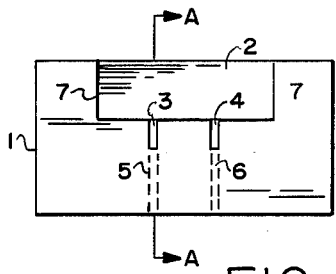
FIG. 3 is a front view of the base portion of a test jack in accordance with the present invention.

A further understanding of the present invention may be had by reference to the following description taken in connection with the accompanying drawings. Referring first to FIG. 1 a test jack assembly consists of a base portion 1, a plurality of contact springs 21 and 22 each having an associated terminal (23 & 24) respectively and a retaining block portion 11. The base portion 1 is shown in detail in FIGS. 2, 3 and 4 wherein corresponding numbers refer to the same parts.

Figure 4:
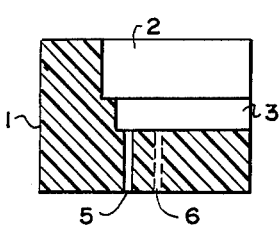
FIG. 4 is a sectional view taken along lines A—A in FIG. 1 and FIG. 2, or the base portion of a test jack in accordance with the present invention.

The base portion 1 includes an upper surface 2 surrounded by a shoulder portion or portions 7. These shoulders provide a retaining wall against which retaining block portion 11 is fitted. Included in the base portion below the upper surface 2 are a plurality of slots 3 and 4 each slot being of a shape and size to accommodate a portion of one of the terminal contact springs 21 or 22. Each slot 3 and 4 contains an opening 5 or 6 respectively which extends through the base 1 to its bottom. Referring to FIG. 4 which is a section taken along lines A—A of FIGS. 2 or 3 it will be noted that the openings 5 and 6 extending from slots 3 and 4 respectively are offset with relationship to each other. This arrangement provides more adequate spacing between the printed circuit terminal portions of contact springs 21 and 22 respectively, for connection to a printed circuit board. However these openings could be parallel to each other if the additional spacing is not required.

Figure 5:
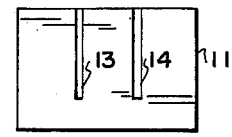
FIG. 5 is a bottom view of a retainer block for use in a test jack in accordance with the present invention.
Figure 6:
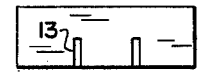
FIG. 6 is a front view of the retainer block for use in a test jack in accordance with the present invention.

Shown in FIGS. 5 and 6 is the upper or retaining block which forms a portion of the test jack of the present invention. The spring retaining block 11 includes a plurality of slots 13 and 14 which are of approximately the same size as those found in the base portion 1. It would be obvious from reference to FIG. 1 that about half of each of the spring contacts 21 and 22 is retained in the slots in the base portion 1 and the other half of each spring contact is retained in the slots in the spring retaining block 11.

Figure 7:
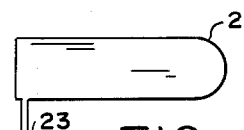
FIG. 7 is a drawing of one form of a contact spring for use with the test jack of the present invention.
Figure 8:
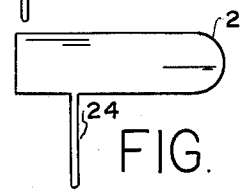
FIG. 8 is a drawing of another form of contact spring for use with the test jack of the present invention.

Each of the spring contact members 21 and 22 shown in FIGS. 7 and 8 respectively, include a printed circuit terminal portion 23 and 24 respectively. These portions, when the jack is assembled pass through the openings 5 and 6 respectively. It will be noted that to correspond with the location of the openings 5 and 6 the terminals 23 and 24 are in different locations on the two spring contact members 21 and 22. As described previously this is merely to affect additional contact spacing. However it is not a requirement of the present invention.

For assembly the spring contacts 21 and 22 are positioned within the slots 3 and 4 of the base portion 1 with their terminals 23 and 24 extending through openings 5 and 6 respectively. The retaining block 11 is then positioned within the shoulder portion 7 of the base 1 with the slots 13 and 14 engaging spring contacts 21 and 22 respectively. Before assembly a bonding agent may be placed between the surfaces of base 1 and retainer block 11 which are in contact with each other so that they may be permanently connected. However it has been found that by means of ultrasonic welding the plastic material of which base 1 and retaining block 11 are formed can be welded to each other to economically provide a high degree of mechanical integrity.

While but a single embodiment of the present invention has been shown it will be obvious to those skilled in the art that numerous modifications may be made without departing from the spirit and scope of the present invention which shall be limited only by the claims appended hereto.

What is claimed is:

1. A telephone test jack adapted for mounting on a printed circuit card and adapted to receive a male type test plug, said jack comprising: a base portion of insulating material including a shoulder portion extending upward from a portion of said base, a plurality of parallel spaced contact spring receiving slots included in the upper surface of said base portion and a plurality of openings in the bottom surface of said base, each of said openings connected to a different one of said slots; a plurality of electrically conductive contact springs each including a printed circuit card terminal and a test plug engaging end, and each mounted in a different one of said base portion slots with said printed circuit card terminal portion extending through a different one of said base portion surface openings; and a spring retaining portion of insulating material positioned on top of said base portion and within said shoulder portion, said retaining portion including a plurality of parallel spaced spring receiving slots in the bottom surface thereof; said spring retaining portion and said base portion in combination supporting each of said contact springs and insulating said springs from each other.

2. A telephone test jack as claimed in claim 1 wherein: said base portion is rectangular in shape and said shoulder portion extends upward from three sides thereof and said spring retaining portion is rectangular shaped with three sides thereof of a size to be retained within said shoulder portion.

3. A telephone test jack as claimed in claim 1 wherein: said spring retaining portion is affixed to said base portion by ultrasonic welding.

* * * * *

UNITED STATES PATENT AND TRADEMARK OFFICE
CERTIFICATE OF CORRECTION

PATENT NO. : 4,034,157
DATED : July 5, 1977
INVENTOR(S) : Eugene R. Hrdlicka, et al.

It is certified that error appears in the above—identified patent and that said Letters Patent are hereby corrected as shown below:

Column 4, line 13, after "portion" insert --bottom--

Signed and Sealed this

Twenty-seventh Day of September 1977

[SEAL]

Attest:

RUTH C. MASON
*Attesting Officer*

LUTRELLE F. PARKER
*Acting Commissioner of Patents and Trademarks*